United States Patent
Awaji

(10) Patent No.: US 6,806,719 B2
(45) Date of Patent: Oct. 19, 2004

(54) INSULATION INSPECTION APPARATUS FOR MOTOR

(75) Inventor: Hideo Awaji, Kanagawa-ken (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 09/996,596

(22) Filed: Nov. 30, 2001

(65) Prior Publication Data

US 2002/0125895 A1 Sep. 12, 2002

(30) Foreign Application Priority Data

Mar. 7, 2001 (JP) ........................................ 2001-063817

(51) Int. Cl.[7] .............................................. H04B 3/046
(52) U.S. Cl. ...................................... 324/541; 324/544
(58) Field of Search .............................. 324/541, 544, 324/509, 510, 536, 529, 772, 539, 543, 545, 551, 580

(56) References Cited

U.S. PATENT DOCUMENTS

| | | | | |
|---|---|---|---|---|
| 4,335,348 A | * | 6/1982 | Reed et al. | 324/538 |
| 5,075,628 A | * | 12/1991 | Schuster et al. | 324/510 |
| 6,452,416 B1 | * | 9/2002 | Kaneda et al. | 324/772 |

* cited by examiner

*Primary Examiner*—Guy J. Lamarre
*Assistant Examiner*—James C. Kerveros
(74) *Attorney, Agent, or Firm*—Foley & Lardner LLP

(57) ABSTRACT

An insulation inspection apparatus flows a current into power lines arranged along power lines of motors and sequentially switches relays to measure electromotive forces induced in the power lines of the DC motor, so that the insulation characteristics of the motors are inspected. This provides an insulation inspection apparatus which can perform insulation inspection of a motor for a short period of time without separating the motor from a control device.

13 Claims, 8 Drawing Sheets

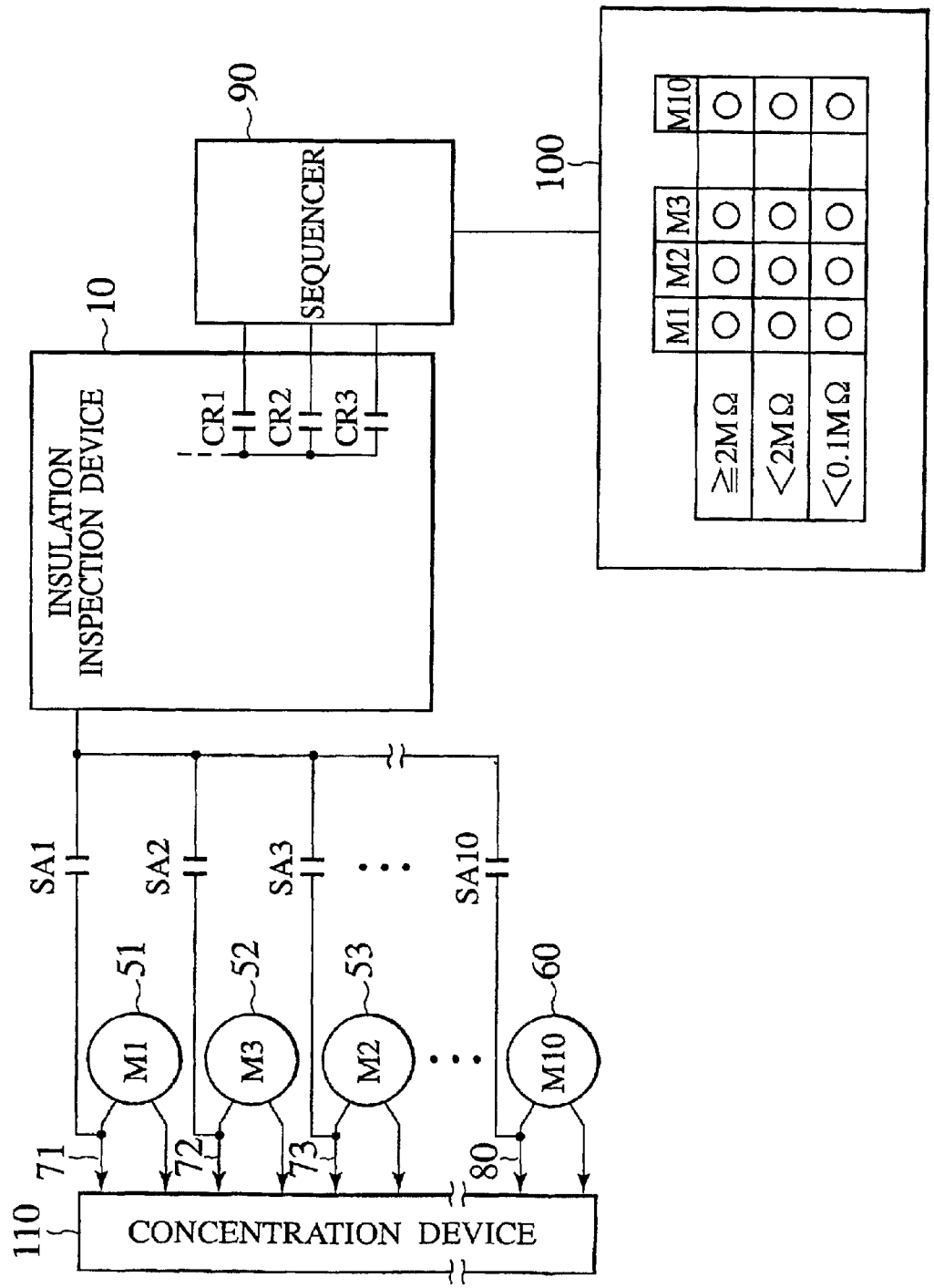

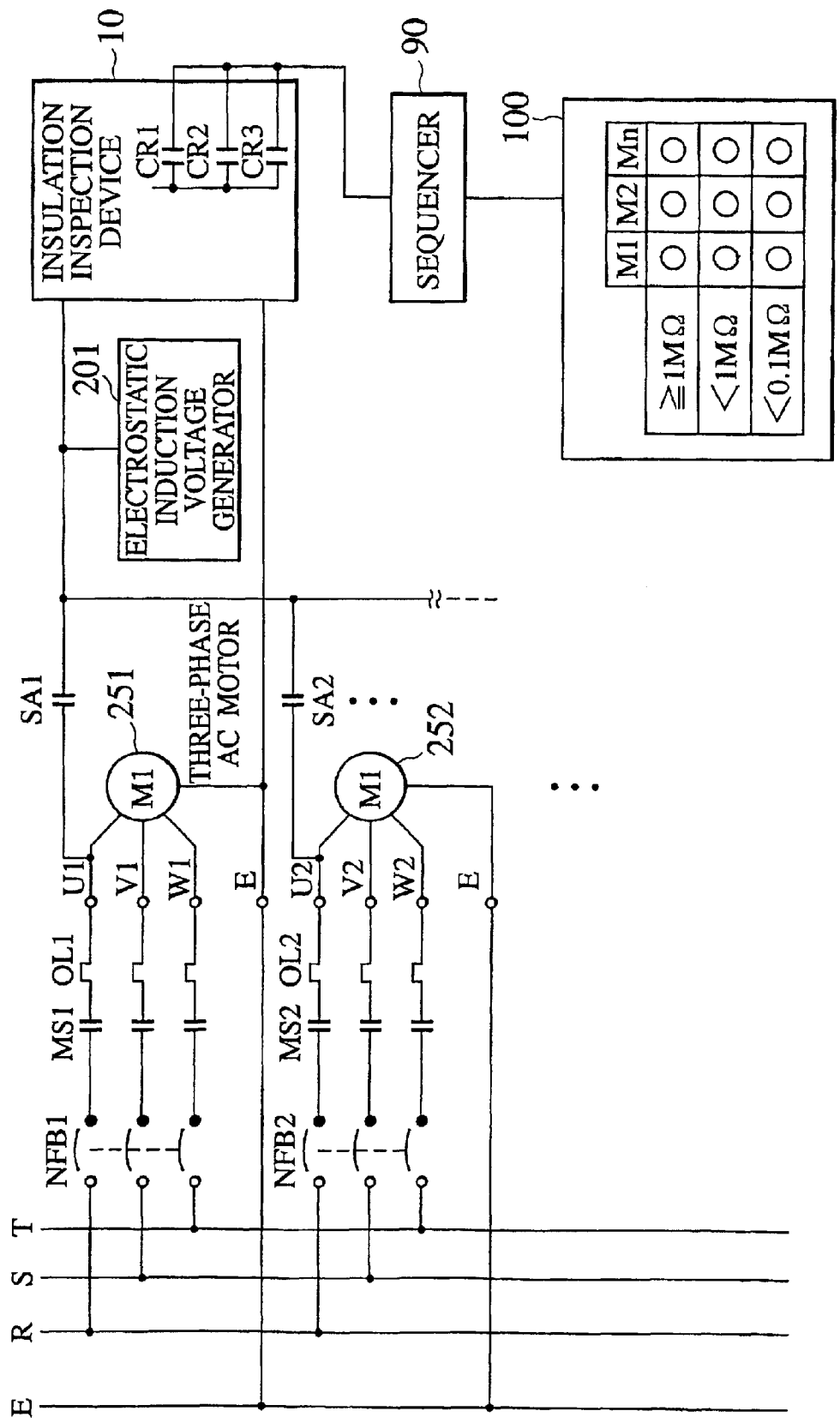

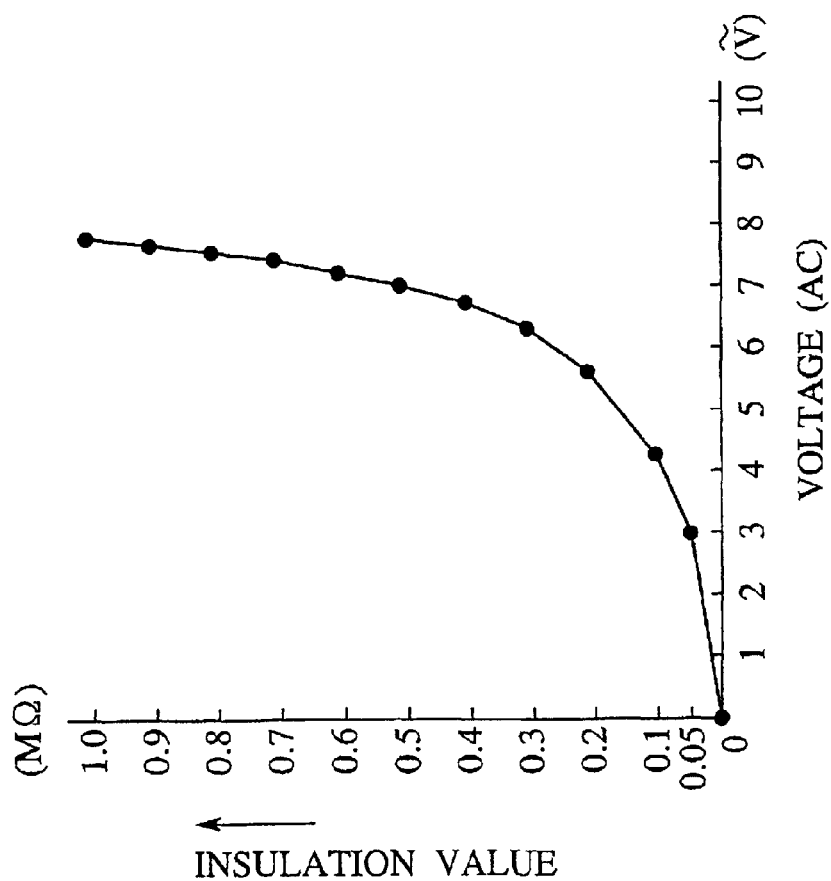

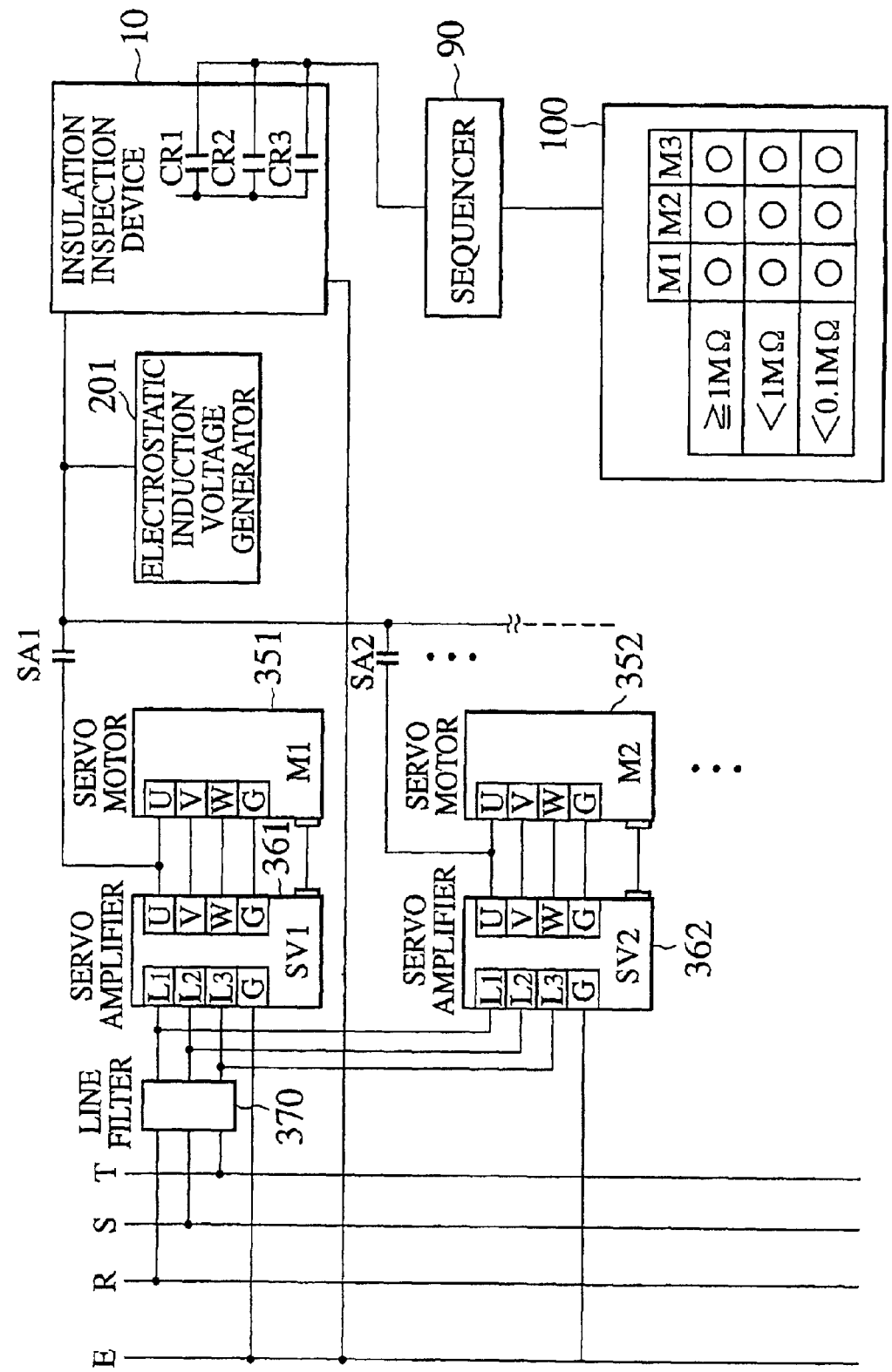

| INSULATION VALUE (MΩ) | VOLTAGE (Ṽ) |
|---|---|
| 0 | 0 |
| 0.05 | 3.3 |
| 0.1 | 5.0 |
| 0.2 | 6.9 |
| 0.3 | 7.9 |
| 0.4 | 8.4 |
| 0.5 | 8.7 |
| 0.6 | 9.0 |
| 0.7 | 9.1 |
| 0.8 | 9.3 |
| 0.9 | 9.4 |
| 1.0 | 9.5 |
| ∞ | 10.3 |
| NO CONNECTION | 14.2 |

US 6,806,719 B2

INSULATION INSPECTION APPARATUS FOR MOTOR

BACKGROUND OF THE INVENTION

The present invention relates to insulation inspection apparatus for inspecting the insulation of a motor.

Since a motor has a structure in which a brush is in contact with a commutator, the brush is worn, and abrasion powder is scattered. Because of the abrasion powder, the insulation between a motor case or another metal part and the electric system of the motor is subject to be deteriorated. In addition, dust may enter into the motor by using the motor for a long period of time, and the insulation may be deteriorated.

The deterioration of insulation may occur regardless of the types of motors such as a DC motor and an AC motor to cause an accident of stopping the motor or a leakage accident. For this reason, the insulation of the motor must be periodically or appropriately inspected.

As a conventional insulation inspection method, a method called a so-called mega test and the like is used. For example, a high voltage, which does not break a motor, is applied between the power lines and the ground of the motor, and a resistance at this time is measured to perform the test.

SUMMARY OF THE INVENTION

However, in the method in which a power voltage is applied to a motor, in order to prevent the high voltage from flowing into the control device of the motor, the motor and the control device must be completely separated from each other. For this reason, in a conventional insulation inspection, a disconnection operation of a signal line and a connection operation upon completion of the inspection must be performed each time for inspecting the insulation, and very long time is disadvantageously required to perform the insulation inspection.

It is an object of the present invention to provide an insulation inspection apparatus, which can perform insulation inspection for a motor within a short period of time without separating the motor and a control device from each other.

According to a technical aspect of the present invention, an apparatus for inspecting the insulation of a motor includes a charged body which is electrically insulated from a motor electrical wire for supplying a power to the motor and arranged near the motor electrical wire, and a voltage measurement unit which measures an electromotive force induced in the motor electrical wire by the charged body.

According to another technical aspect of the present invention, an apparatus for inspecting the insulation of a motor includes a conductor which is electrically connected to a motor electrical wire for supplying a power to the motor, a charged body which is electrically insulated from the motor electrical wire and the conductor and which is arranged near the conductor, and a voltage measurement device which measures an electromotive force induced in the conductor by the charged body.

According to still another technical aspect of the present invention, a method of inspecting the insulation of a motor includes the step of electrically insulating a charged body arranged near a motor electrical wire from the motor electrical wire for supplying a power to the motor, and the step of measuring an electromotive force induced in the motor electrical wire by the charged body.

BRIEF DESCRIPTION OF THE DRAWINGS

FIG. 3 is a circuit diagram showing the configuration of equipment using an insulation inspection apparatus according to the second embodiment of the present invention;

FIG. 4 is a circuit diagram showing the configuration of equipment using an insulation inspection apparatus according to the third embodiment of the present invention;

FIGS. 7A and 7B are a graph showing an insulation value and a measured voltage for explaining the operation of the insulation inspection apparatus according to the third embodiment and a table showing measured value data, respectively;

FIG. 8 is a circuit diagram showing the configuration of equipment using an insulation inspection apparatus according to the fourth embodiment of the present invention.

DESCRIPTION OF THE PREFERRED EMBODIMENT

Embodiments of the present invention will be described below with reference to the accompanying drawings.

First Embodiment

In the first embodiment, an alternating current is supplied to power lines connected to a control device and concentrated on motor electrical wires (to be referred to as power lines hereinafter) for supplying a power to a DC motor to inspect the insulation of the DC motor on the basis of a voltage of an induced electromotive force induced in the power lines.

Figure 1:
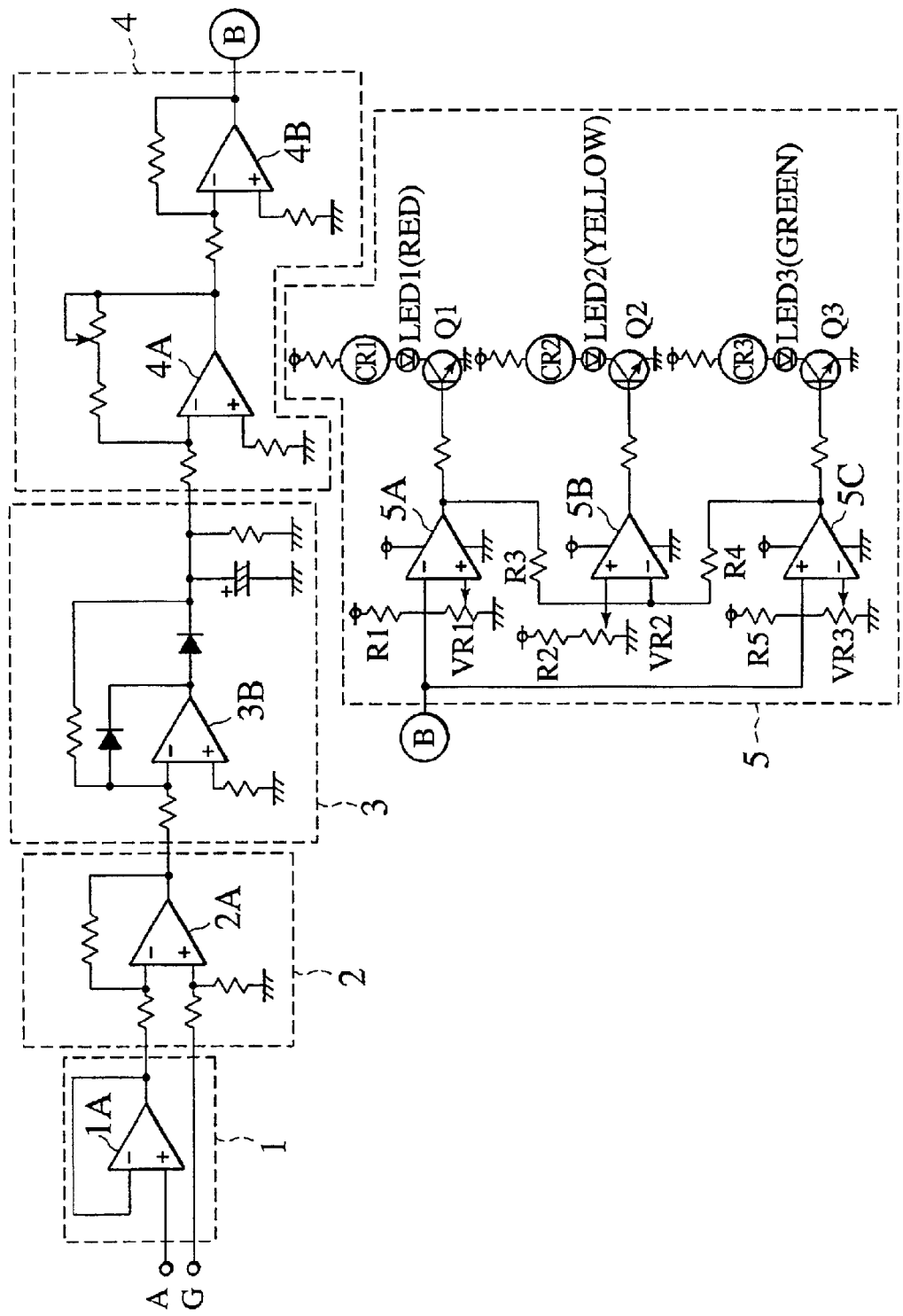
FIG. 1 is a circuit diagram showing the configuration of an insulation inspection apparatus according to the first embodiment to which the present invention is applied.

FIG. 1 is a circuit diagram of an insulation inspection apparatus for a motor to which the present invention is applied. This apparatus is constituted by a buffer circuit 1, a differential amplification circuit 2, a rectification circuit 3, an amplification circuit 4, and a decision circuit 5.

The buffer circuit 1 is constituted by an operational amplifier 1A to detect only a voltage without drawing a current, so that an internal resistance is set to be about 1 GΩ or more. This is to reliably detect an electromotive force induced in the power lines of the DC motor and to protect the subsequent circuits. An input terminal A of the buffer circuit 1 is connected to the power lines of the DC motor, and the other terminal G is connected to the ground.

The differential amplification circuit 2 is a circuit for reliably amplifying a potential difference between a potential detected by the buffer circuit 1 and the ground potential.

The rectification circuit 3 is to convert the detected AC voltage (to be described later) into a DC voltage. In this case, since a weak voltage is detected, the rectification circuit has an ideal diode configuration using an operational amplifier 3A to prevent the voltage from being attenuated when the voltage is converted into a DC voltage caused by nonlinearity characteristics of diode.

The amplification circuit 4 is a circuit for amplifying the rectified DC voltage. The decision circuit 5 is a circuit for simply displaying an insulation performance by a plurality of threshold voltages depending on the value of the amplified voltage. In the decision circuit 5, by setting resistors VR1, VR2, and VR3, operational amplifiers 5A to 5C operate as comparators depending on the value of an input voltage to output binarized (H, L) voltages having high levels (H) or low levels (L). Therefore, a switching transistor is OFF (inactive) with respect to an L-level output and the switching transistor is turned ON (active) when the transistor receives an H-level output to turn on a corresponding LED.

In this embodiment, when the insulation performance Z of the motor is smaller than 0.1 MΩ (Z<0.1 MΩ), a detection voltage is equal to or smaller than a predetermined value regulated by resistors R1 and VR1. For this reason, a comparator 5A outputs an H-level output, and an LED1 is turned on to indicate as a third grade (off in the other case). When the insulation performance of the motor is 2 MΩ or more (Z≧2 MΩ), the detection voltage is equal to or larger than a predetermined value regulated by resistors R5 and VR3. And a comparator 5C outputs an H-level output, and an LED3 is turned on to indicate as a second grade (off in the other case). When the insulation value is equal to or larger than 0.1 MΩ and smaller than 2 MΩ (0.1 M≦Z<2 MΩ), both the comparators 5A and 5C output L-level outputs. Therefore, a weighted average value of these outputs is determined by resistors R3 and R4 is equal to or smaller than a value regulated by resistors R2 and VR2, a comparator 5B outputs an H-level output, and an LED2 is turned on to indicate as a first grade (off in the other case). Of the respective LEDs, for example, the LED1 is set in red as the third grade, the LED2 is set in yellow as the second grade, and the LED3 is set in green as the first grade. The insulation performance can be easily visually understood by the colors of the LEDs' emission.

According to the ON/OFF states of the LED1, the LED2, and the LED3, switching devices CR1, CR2, and CR3 such as relays and the like corresponding to these LEDs are turned on/off. For this reason, pieces of information of three stages related to a decision result obtained by the ON/OFF states of the relays are outputted to another device (see the second embodiment described later). The switching devices CR1 to CR3 are controlled by drive currents of the LEDs as shown in FIG. 1, a modification in which the switching devices are controlled by output voltages from the comparators 5A to 5C or for switching transistors Q1 to Q3 can be effected. Therefore, in addition to the relays, power control element such as photocouplers, transistors, or TRIACs can also be employed as switching devices.

An operation in the first embodiment will be described below. In this apparatus, as described above, the voltage of an induction electromotive force is induced in the power lines of the DC motor to inspect insulation. The induction electromotive force, as well known, is generated in an electrically insulated conductor by an electrostatic induction function when a charged body is near the electrically isolated conductor.

Therefore, in the DC motor, when the power supply input of the power lines for supplying a power to the motor is disconnected and the charged body is close to the power lines, and then if the DC motor is set in an ideal insulating state, an electromotive force is generated in the power lines by the electrostatic induction function. The present inventors made it apparent that the voltage of the electromotive force as described above, which is generated in the power lines by electrostatic induction, is substantially proportional to the insulation resistance of the motor.

This apparatus measures the voltage of an induction electromotive force generated in the power lines of the DC motor. In order to generate electrostatic induction, a charged body must be arranged near the power lines, in this embodiment, power lines for a motor control device arranged along the power lines of the DC motor are used as a charged body for generating the electrostatic induction. This configuration utilizes a concentration method, which is often used in a normal factory and the like. In the factory and the like, since various electric equipments are used, electrical wires for these electric equipments are necessary and indispensable. From the viewpoints of the facility of a maintenance operation, the facility of wires, or the prevention of an electric accident, a method of concentrically wiring power lines to various electric equipments and signal lines for control is employed. The power lines of the DC motor, the power lines of the control device, and the like are similarly concentrated at one position and bundled. Therefore, the power lines of the DC motor are disconnected from the power supply (in general, only the switch of the motor may be disconnected), and a power is supplied only to the control device of the motor, so that the power lines of the motor can be electrostatically inducted. Since the power lines of the control device are connected to a commercial power supply (AC 100 V to 110 V), an electromotive force induced in the power source of the DC motor is also an AC voltage.

Figure 2A:
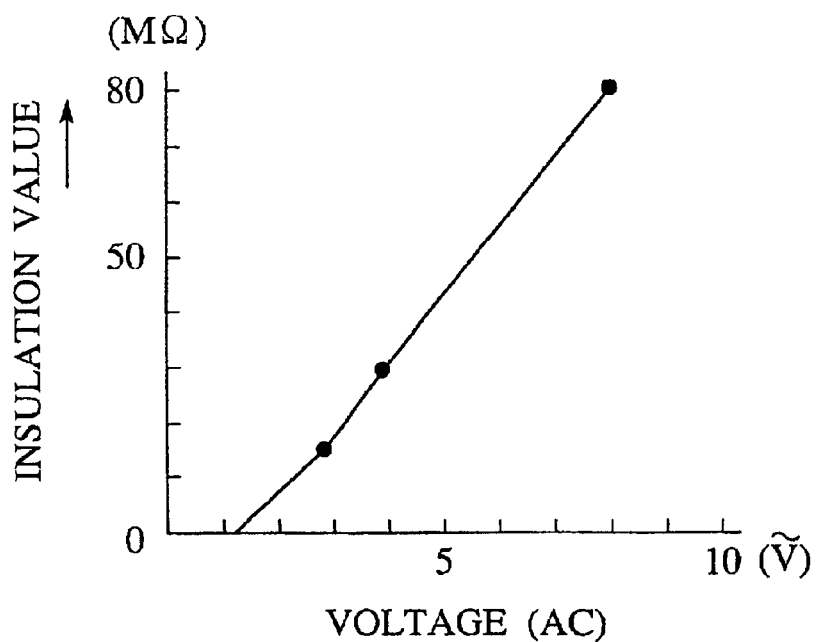
FIGS. 2A and 2B are graphs for explaining inspection results obtained by the insulation inspection apparatus.
Figure 2B:
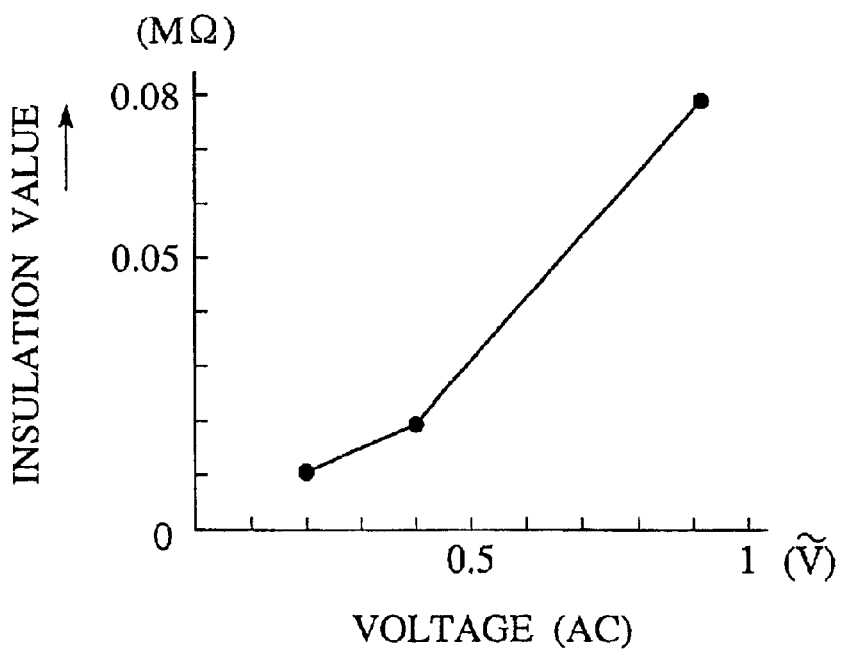

FIGS. 2A and 2B are graphs showing correlations between results obtained by inspecting insulation by a conventional method such as a mega test method and voltages (AC) measured by the apparatus of the present invention. In FIGS. 2A and 2B, FIG. 2A shows a state in which the insulation is relatively good, and FIG. 2B shows a state in which the insulation is not good.

As is apparent from FIGS. 2A and 2B, the voltages are substantially in proportion to insulation values (resistances). As shown in FIG. 2A, an insulation of 10 MΩ or more can be obtained when the voltage is 3 V or more. On the other hand, as is apparent from FIG. 2B, when the measured voltage is 1 V or less, the insulation value is 0.1 MΩ or less at which maintenance of the apparatus must be performed. As a result of the experiment, although a measured voltage varies depending on the structure of the motor, the length of the power lines of the DC motor, the length of the power lines of the control device arranged along the power lines of the DC motor, and the like, the voltage has a maximum value of about 8 to 10 V when an insulation is infinite.

According to the embodiment, when only an induction electromotive force generated in the power lines of the DC motor is measured, the insulation of the DC motor can be easily inspected. Therefore, unlike the conventional technique, a high voltage need not be applied to the DC motor, cumbersome advance preparations such as removal of signal lines between the control device of the motor and the motor are not required. For this reason, insulation inspection can be easily performed within a short period of time.

In addition, a conductor is connected to motor electrical wires, and a charged body is arranged near the conductor. For this reason, the insulation inspection apparatus of the embodiment can be easily arranged at a position where an additional charged body cannot be placed near motor electronic wires, and the insulation can be inspected.

Furthermore, since the electrical wires in which an alternating current flows are used as the charged body, electrical wires used in various electric equipments can be used without being changed. For this reason, insulation inspection can be easily performed.

Since power lines, arranged along motor electrical wires, for supplying a power to a control device of a motor are used as a charged body, any advance preparations are not required, and insulation inspection can be very easily performed.

Second Embodiment

In the second embodiment, in a factory and the like in which a plurality of DC motors are installed, the insulations of the plurality of DC motors can be efficiently inspected by using the insulation inspection device of the present invention. FIG. 3 is a diagram showing an equipment configuration for inspecting the insulations of the plurality of DC motors.

In the embodiment, DC motors to be inspected include 10 motors, i.e., a first motor 51 to a tenth motor 60. An input terminal A of a buffer circuit 1 of the insulation inspection apparatus 10 is connected to power lines 71 to 80 of the DC motors 51 to 60 by branch lines through switching devices (relays) SA1 to SA10.

The insulation inspection apparatus 10 is the same as that described as the first embodiment. ON/OFF signals from switching elements CR1, CR2, and CR3 of a decision circuit 5 are connected to a sequencer 90. The lamp of a display panel 100 for displaying, e.g., an operation state of the motor is turned on or off by the sequencer 90, so that the insulations of the respective DC motors can be understood.

The other configuration is the same as that in the first embodiment, and a description thereof will be omitted. The power lines of the motors are concentrated along the power lines of the control devices of the motors in the concentration device 110.

An operation in the second embodiment will be described below. In this embodiment, power is supplied only to the control devices before power is supplied to the DC motors. In this stage, since induction electromotive forces are generated in power lines of the DC motors, the voltages of the induction electromotive forces generated in the power lines 71 to 80 are measured by the insulation inspection apparatus 10 by sequentially switching the relays SA1 to SA10. According to each of the measured insulation values Z set in one of a range of smaller than 0.1 MΩ (Z<0.1 MΩ) as a third grade, a range of 0.1 MΩ or more and smaller than 2 MΩ (0.1 MΩ≦Z<2 MΩ) as a second grade, and a range of 2 MΩ or more (Z≧2MΩ) as a first grade, as in the first embodiment, one of the LED1 to LED3 in the decision circuit is turned on to indicate determined grade of insulation value, and signals which turns on the LEDs are output to the sequencer 90. In the sequencer 90, on the basis of signal output depending on the ranges of the insulation values, the lamps of the display panel 100 are turned in units of the measured DC motors.

Since the insulation of the plurality of motors can be easily inspected such that the switching of the relays SA1 to SA10. are controlled by the sequencer, the insulation inspection of the plurality of DC motors can also be completely automated.

In this manner, according to this embodiment, only branch lines should be connected to the power lines of the DC motors through the relays to perform insulation inspection, and the insulation inspection can be easily performed by one insulation inspection apparatus 10. Therefore, the insulation inspection for the motors can be performed everyday before the motors are started.

Third Embodiment

In a factory and the like in which a plurality of AC motors are equipped, the insulation of the plurality of AC motors can be inspected by using the insulation inspection apparatus according to the present invention.

FIG. 4 is a diagram showing an equipment configuration for performing insulation inspection to a plurality of AC motors. In this embodiment, although a plurality of AC motors including AC motors (M1, M2) 251 and 252 are to be inspected, the AC motors M1 and M2 will be described below. An electrostatic induction voltage generator 201 (to be described later) connected to an insulation inspection apparatus 10 is connected to power lines U1 and U2 of the AC motors 251 and 252 by branch lines through relays SA1 and SA2. The power lines of the motor for connecting the relays SA1 and SA2 are not limited to the illustrated power lines U1 and U2, and any one of three-phase power lines U, V, and W may be used.

The insulation inspection apparatus 10 is the same as that described as the first embodiment. Signals from switching elements CR1 to CR3 of the decision circuit 5 are connected to a sequencer 90 as in the second embodiment. The sequencer 90 turns on/off the lamps of a display panel 100 for displaying an operation state of the motor, so that the insulation of the respective AC motors can be easily visually understood.

The AC motors of this embodiment are three-phase AC motors. Three-phase power supply lines R, S, and T and power lines U1, V1, and W1 are connected to each other through a breaker (NFB), a main switch (MS), and the like, and the ground terminal (or a motor case) of each motor is connected to a ground line E.

Figure 5:
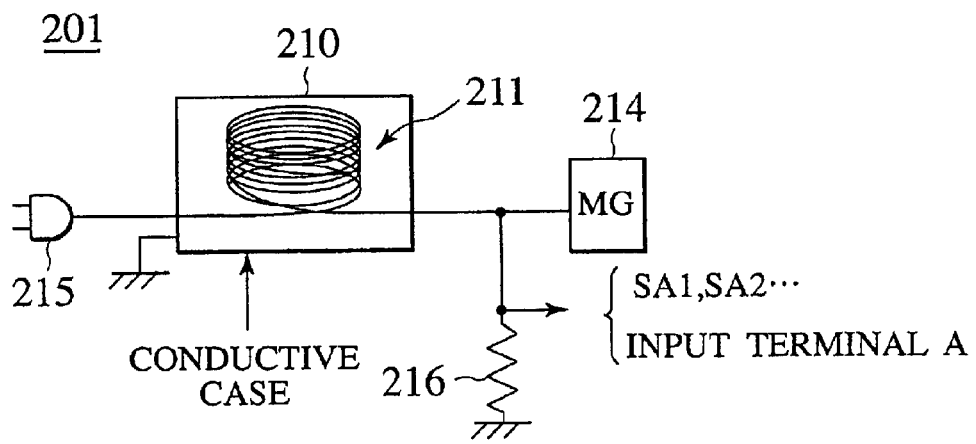
FIG. 5 is a schematic diagram for explaining an electrostatic induction voltage generator using the insulation inspection apparatus according to the third embodiment.
Figure 6:
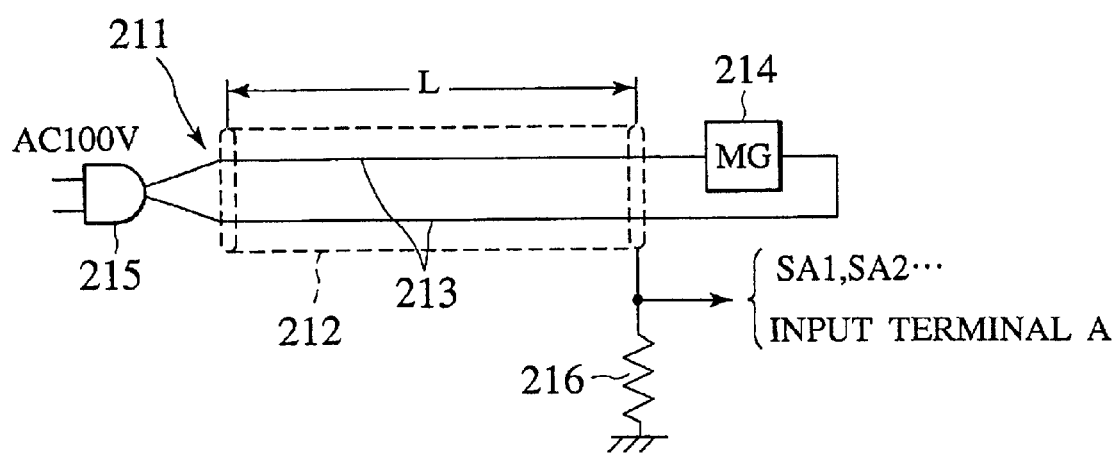
FIG. 6 is a circuit diagram for explaining twin-core shielded electrical cable used in the electrostatic induction voltage generator.

In this embodiment, the dedicated electrostatic induction voltage generator 201 is used to measure an induction electromotive force. FIG. 5 is a schematic diagram of the electrostatic induction voltage generator 201. The electrostatic induction voltage generator 201 has a very simple configuration in which a twin-core shielded electrical cable 211 is accommodated in a conductive case 210, which is grounded. As shown in FIG. 6, a shielded conductor 212 of the twin-core shielded electrical cable 211 is connected to branch lines connected to the relays SA1 and SA2 and the like and an input terminal A of a buffer circuit 1 of the insulation inspection apparatus 10. In FIG. 6, although the shielded conductor 212 is indicated by a dotted line, core wires 213 in a range indicated by the dotted line are shielded.

A plug 215 which is to be connected to a commercial 100 V/110 V power supply is connected to one end of the core wires 213 of the twin-core shielded electrical cable 211, and a magnet switch 214 is connected to the other end of the core wires 213 as a load for flowing an alternating current into the core wire 213. With regard to the load, an arbitrary load having predetermined impedance is employed, for example, an incandescent light bulb may be used.

The operation of the third embodiment will be described below. In the embodiment, the electrostatic induction voltage generator 201 described above is used. The electrostatic induction voltage generator 201 is obtained such that the twin-core shielded electrical cable 211 is accommodated in the conductive case 210, which is grounded. Therefore, when an alternating current is flowed into the core wires 213, an induction electromotive force is efficiently generated by an electrostatic induction function on the shielded conductor 212 covering the core wires 213.

In the embodiment, the plug 215 is connected to a general commercial power supply outlet (not shown), the magnet switch 214 connected to the core wires 213 is turned on, so that an AC current flows in the core wires 213.

As an electromotive force generated in the shielded conductor 212 when an alternating current flowed, when a shielded electrical cable having a length L of, e.g., 3 m was used, a voltage of, e.g., about 23 V was generated as a result of an experiment when a shield conductor was not grounded. This value varies depending on the length or characteristics of a shielded electrical cable to be used.

On the other hand, the insulation inspection apparatus 10 is the same as that in the first embodiment. Since the insulation inspection apparatus 10 can detect a considerably low voltage, an electromotive force generated in the shielded electrical cable 211 is excessively high as a voltage input to the insulation inspection apparatus 10. In the embodiment, a resistor 216 is brought into contact with the shielded conductor 212 to establish a ground state, a voltage input to the insulation inspection apparatus 10 is adjusted to about 10 V. When the resistance of the resistor 216 is changed, the voltage input to the insulation inspection apparatus 10 can be adjusted. In contrast to this, if the voltage input to the insulation inspection apparatus 10 is not limited, the insertion of the resistor is not necessary.

In the electrostatic induction voltage generator 201, since the shielded electrical cable 211 is accommodated in the conductive case 210 which is grounded, the influence of an external electromagnetic wave is suppressed by an electromagnetic shield effect, and a stable induction electromotive force can be obtained.

FIGS. 7A and 7B are a graph and a table which show results obtained by examining the insulation performance of an actual AC motor. FIG. 7A is a graph showing a relationship between insulation values of an AC motor and voltages of induction electromotive forces, and FIG. 7B shows measured values of the insulation values and the voltages in FIG. 7A.

In an experiment, resistors having various resistances were inserted between the motor case (ground terminal) of an actual AC motor and a power line U, and the motor case and the power line U were connected to each other, so that various insulation states were pseudly set. Inspection was performed such that the insulation inspection apparatus according to the embodiment was connected to the test motor. Values obtained by measuring the voltages of induction electromotive forces at this time are the results shown in FIGS. 7A and 7B. In FIGS. 7A and 7B, an insulation value is infinite (∞) indicates a state in which no resistor is inserted between the motor case and the power line.

As is apparent from FIGS. 7A and 7B, the insulation values are clearly correlated to the measured voltages. Therefore, the insulation state of the AC motor can be reliably inspected according to the embodiment.

In case of the AC motor used in the experiment, it is assumed that an insulation value of 1 MΩ or more indicates an almost preferable insulation state as a first grade. In this case, "preferable" is indicated when a voltage obtained by a measured induction electromotive force is 7.7 V or more, "attention" is indicated as a second grade when the insulation value is 0.1 MΩ or more and smaller than 1 MΩ because the voltage falls within the range of 4.2 V to 7.6 V, and "defective" is indicated as a third grade when the insulation value is smaller than 0.1 MΩ because the voltage is smaller than 4.2 V. When the relays CR1, CR2, and CR3 are set to output signals depending on these cases, the lamps of the display panel 100 can be turned on/off by the sequencer 90 to display measurement result, and the insulation performances of the motor can be displayed according to their grade.

Therefore, according to the present invention, since a shield conductor covering an AC electrical wire is used as a conductor connected to a motor electrical wire, an insulation inspection apparatus can be easily fabricated by using a shielded electrical cable.

Since AC electrical wires and a shield conductor covering the AC electrical wires are accommodated in a conductive case which is grounded, an external electromagnetic influence to the shielded conductor which generates an induction electromotive power can be prevented.

In addition, since motor electrical wires of a plurality of motors, a voltage measurement means, and a conductor are connected to each other through relays, the insulation of the plurality of motors can be easily inspected by merely sequentially switching the relays. Since a display means for displaying measurement results of the voltage measurement means according to their grades of insulation is arranged, the insulation of the motors can be clearly displayed.

Fourth Embodiment

In the fourth embodiment, the insulation of a plurality of AC servo motors are inspected. FIG. 8 is a diagram showing an equipment configuration for performing insulation inspection to a plurality of AC servo motors. This embodiment is same as the third embodiment except that object to be inspected are the plurality of AC servo motors.

For this reason, an electrostatic induction voltage generator 201 connected to an insulation inspection apparatus 10 by branch lines through relays SA1 and SA2 is connected to power lines U between a plurality of AC servos including AC servo motors 351 and 352 and servo amplifiers 81 and 82 for controlling the plurality of AC servos. Power lines for connecting the relays SA1 and SA2 are not limited to the illustrated power lines U, one of three-phase power lines U, V, and W may be used.

The power line systems of the AC servo motors 351 and 352 are general systems. As shown in FIG. 8, the power lines U, V, and W from the servo amplifiers 361 and 362 are connected to the AC servo motors 351 and 352, and three-phase power supply lines R, S, and T are connected to the servo amplifiers 361 and 362 through a line filter 370. Ground terminals G of the AC servo motors 351 and 352 and the ground terminals G of the servo amplifiers 361 and 362 are connected to a ground line E.

Figures 9A, 9B:
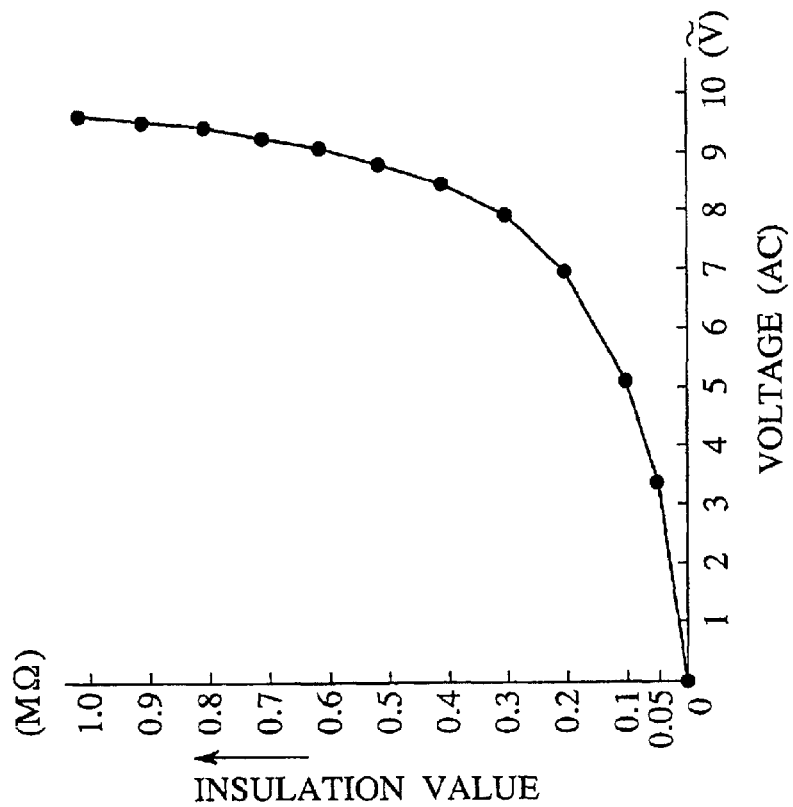
FIGS. 9A and 9B are a graph showing an insulation value and a measured voltage for explaining the operation of the insulation inspection apparatus according to the fourth embodiment and a table showing measured value data, respectively.

FIGS. 9A and 9B show results obtained by examining the insulation performance of an actual AC servo motor according to the embodiment. FIG. 9A is a graph showing the relationship between insulation values of an AC motor and voltages of induction electromotive forces, and FIG. 9B shows measured values of the insulation values and the voltages in FIG. 9A.

In an experiment, resistors having various resistances were inserted between the ground terminal G of an actual AC servo motor and the power line U to form a short circuit between the ground terminal G and the power line U, so that various insulation states are pseudly set. Inspection was performed such that the insulation inspection apparatus according to the embodiment was connected to the test motor. Values obtained by measuring the voltages of induction electromotive forces at this time are the results shown in FIGS. 9A and 9B. In FIGS. 9A and 9B, an insulation value is infinite (∞) indicates a state in which no resistor is inserted between the ground terminal G and the power line. No connection in FIG. 9B indicates a state of relay SA being isolated(off).

As is apparent from FIGS. 9A and 9B, the insulation values are clearly correlated to the measured voltages. Therefore, according to the embodiment, the insulation state of the AC motor can be reliably inspected.

In case of the AC servo motor used in the experiment, it is assumed that an insulation value of 1 MΩ or more indicates an almost preferable insulation state. In this case, "preferable" as a first grade is indicated when a voltage obtained by a measured induction electromotive force is 9.5 V or more, "attention" as a second grade is indicated when the voltage falls within the range of 5.0 V to 9.4 V when the insulation value is 0.1 MΩ or more and smaller than 1 MΩ, and "defective" as a third grade is indicated when the voltage is smaller than 5.0 V when the insulation value is smaller than 0.1 MΩ. When the relays CR1, CR2, and CR3 are set to output signals when these voltages are detected, the lamps of the display panel 100 can be turned on/off by the sequencer 90 to display the insulation performances of the motor can be displayed according to their grades.

Although the embodiments of the present invention have been described above, the present invention is not limited to the above embodiments. For example, in the first embodiment, in order to cause power lines of a DC motor to generate electrostatic induction, electricity is flowed in power lines of a motor control device concentrated along the power lines of the DC motor. Such a configuration can be applied to not only a DC motor but also an AC motor. As a charged body, any charged motor which is completely electrically insulated from the power lines of the motor and which are wired along the power lines of the motor may be used. For example, electrical wires of another device, which are not related to motor equipment at all, may be used. In addition, when there are no other wires along the power lines of the motor, other dedicated electrical wires (for example, the power lines of a commercial AC power supply of 100V/110V) for insulation inspection can be arranged along the power lines of the motor. In this manner, as in the embodiments described above, it will be apparent to skilled persons that the insulation of a motor as in the embodiments described above.

A DC motor can be also inspected by using the electrostatic induction voltage generator as in the third embodiment or the fourth embodiment. As a shielded electrical cable used in the electrostatic induction voltage generator, in addition to a twin-core shielded electrical cable, a single-core shielded electrical cable may be used.

Furthermore, in the embodiments described above, insulation performances are displayed by LEDs or lamps of a display panel in the range of three grades depending on measured voltages. In addition to the three-grade display configuration, various display configurations, e.g., a two-grade display configuration obtained by checking whether an insulation performance is at a reliable level or not, a multi-grade display configuration such as a four-grade display configuration or a five-grade display configuration, or a display configuration in which numerical values are displayed as concrete insulation values can also be used.

This application claims benefit of priority under 35USC §119 to Japanese Patent Applications No. 2001-63817, filed on Mar. 7, 2001, the entire contents of which are incorporated by reference herein. Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. An apparatus for inspecting insulation of a motor comprising:
    a power line for supplying a power to a control device of the motor, the power line being arranged along an electrical wire for supplying a power to the motor and being electrically insulated from the electrical wire; and
    a voltage measurement unit measuring an electromotive force in the electrical wire induced by supplying the power to the power line.

2. An apparatus according to claim 1, wherein the power line is an AC electrical wire in which an alternating current flows.

3. An apparatus for inspecting the insulation of a motor comprising:
    a shielded conductor covering an electrical wire, the shielded conductor being electrically connected to a motor electrical wire for supplying a power to the motor, the electrical wire being arranged near an electrical wire for supplying a power to the motor and being electrically insulated from the motor electrical wire and the shielded conductor; and
    a voltage measurement device measuring an electromotive force in the shielded conductor induced by supplying a current to the electrical wire.

4. An apparatus according to claim 3, wherein the electrical wire and the shielded conductor are accommodated in a conductive case which is grounded.

5. An apparatus according to claim 3, wherein an alternating current flows in the electrical wire.

6. An apparatus for inspecting insulation of a motor comprising;
    a charged body which is arranged near an electrical wire for supplying a power to the motor, the charged body being electrically insulated from the electrical wire; and
    a voltage measurement unit measuring an electromotive force induced in the electrical wire by the charged body, wherein
    the voltage measurement device is connected to a plurality of motors through relays.

7. An apparatus for inspecting the insulation of a motor comprising:
    a conductor which is electrically connected to a motor electrical wire for supplying a power to the motor;
    a charged body which is arranged near an electrical wire for supplying a power to the motor, the charged body being electrically insulated from the motor electrical wire and the conductor, and
    a voltage measurement device measuring an electromotive force induced in the conductor by the charged body, wherein
    the conductor is connected to a plurality of motors through relays.

8. An apparatus for inspecting insulation of a motor comprising:
    a charged body which is arranged near an electrical wire for supplying a power to the motor, the charged body being electrically insulated from the electrical wire;
    a voltage measurement unit measuring an electromotive force induced in the electrical wire by the charged body; and
    a display device displaying measurement results of the voltage measurement according to their grades insulation.

9. An apparatus for inspecting the insulation of a motor comprising:
    a conductor which is electrically connected to a motor electrical wire for supplying a power to the motor;
    a charged body which is arranged near an electrical wire for supplying a power to the motor, the charged body being electrically insulated from the motor electrical wire and the conductor;

a voltage measurement device measuring an electromotive force induced in the conductor by the charged body; and a display device displaying measurement results of the voltage measurement according to their grades of insulation.

10. An apparatus for inspecting insulation of a motor comprising:

a charged body which is arranged near an electrical wire for supplying a power to the motor, the charged body being electrically insulated from the electrical wire; and a voltage measurement unit measuring an electromotive force induced in the electrical wire by the charged body, wherein the electrical wire is disconnected from a source supplying said power during measuring by said voltage measurement device.

11. An apparatus for inspecting the insulation of a motor comprising:

a conductor which is electrically connected to a motor electrical wire for supplying a power to the motor;

a charged body which is arranged near an electrical wire for supplying a power to the motor, the charged body being electrically insulated from the motor electrical wire and the conductor; and a voltage measurement device measuring an electromotive force induced in the conductor by the charged body, wherein the electrical wire is disconnected from a source supplying said power during measuring by said voltage measurement device.

12. A method of inspecting the insulation of a motor comprising the steps of:

arranging a charged body electrically insulated from an electrical wire for supplying a power to the motor near the motor electrical wire; and measuring an electromotive force induced in the motor electrical wire by the charged body, wherein the electrical wire is disconnected from a source supplying said power during said measuring.

13. A method of inspecting the insulation of a motor, a motor electrical wire for supplying a power to the motor being electrically connected to a conductor, comprising the steps of:

arranging a charged body electrically insulated from the electrical wire and the conductor near the electrical wire; and measuring the electromotive force induced in the conductor by the charged body, wherein the electrical wire is disconnected from a source supplying said power during said measuring.

* * * * *